(12) United States Patent
Baker et al.

(10) Patent No.: US 10,877,517 B2
(45) Date of Patent: Dec. 29, 2020

(54) ASSEMBLY FOR PORTABLE ELECTRONIC DEVICE

(71) Applicant: Apple Inc., Cupertino, CA (US)

(72) Inventors: John J. Baker, Campbell, CA (US); Yaocheng Zhang, Cupertino, CA (US); Robert T. Carson, Oakland, CA (US); Matthew D. Walker, Los Gatos, CA (US); Martin J. Auclair, Campbell, CA (US); Paul U. Leutheuser, Saratoga, CA (US); Christopher J. Durning, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 43 days.

(21) Appl. No.: 16/250,966

(22) Filed: Jan. 17, 2019

(65) Prior Publication Data

US 2020/0081488 A1 Mar. 12, 2020

Related U.S. Application Data

(60) Provisional application No. 62/729,946, filed on Sep. 11, 2018.

(51) Int. Cl.
| | |
|---|---|
| *G06F 1/16* | (2006.01) |
| *H05K 5/00* | (2006.01) |
| *H05K 1/11* | (2006.01) |
| *H05K 1/02* | (2006.01) |

(52) U.S. Cl.
CPC .......... *G06F 1/1626* (2013.01); *G06F 1/1605* (2013.01); *G06F 1/1656* (2013.01); *H05K 1/0215* (2013.01); *H05K 1/11* (2013.01); *H05K 5/0017* (2013.01)

(58) Field of Classification Search
CPC .... G06F 1/182; G06F 1/1656; H04M 1/0249; H05K 1/0215; H05K 1/0218; H05K 1/0224
See application file for complete search history.

(56) References Cited

U.S. PATENT DOCUMENTS

| | | | | |
|---|---|---|---|---|
| 5,273,459 | A | * 12/1993 | Davis ................. | H01R 13/6593 439/607.48 |
| 6,172,881 | B1 | * 1/2001 | Hirai .................... | H05K 1/148 174/376 |
| 10,496,231 | B2 | * 12/2019 | Naito .................. | H01L 27/0248 |

(Continued)

*Primary Examiner* — Adrian S Wilson
(74) *Attorney, Agent, or Firm* — Morgan, Lewis & Bockius LLP

(57) ABSTRACT

Electronic devices, such as mobile communication devices, may include several enhancements and modification not found on traditional electronic devices. Parts of the electronic device can be welded together to provide structural support and or functional connections between operating components of the electronic device. Within a band, a back plate can support multiple operable components of the electronic device. The band, the welds, and/or the back plate can provide electrical connections between components. Conductive pathways provided by the welds can be provided with adequate strength and durability to reduce and avoid breakage so that sensitive components, such as a compass module, can operate without alterations that would cause interference. The welds can be provided in a sequence that mitigates the effects of heating during the welding process.

16 Claims, 12 Drawing Sheets

(56) References Cited

U.S. PATENT DOCUMENTS

| | | | |
|---|---|---|---|
| 2005/0030233 A1* | 2/2005 | Kim | H01Q 1/48 343/702 |
| 2006/0104013 A1* | 5/2006 | Sakakibara | G06F 1/1656 361/679.11 |
| 2008/0242126 A1* | 10/2008 | Tseng | H05K 1/0215 439/78 |
| 2009/0257189 A1* | 10/2009 | Wang | H05K 5/061 361/679.56 |
| 2010/0061040 A1* | 3/2010 | Dabov | G06F 1/1656 361/679.01 |
| 2011/0186345 A1* | 8/2011 | Pakula | G06F 1/1637 174/520 |
| 2011/0255218 A1* | 10/2011 | Pakula | H05K 5/03 361/679.01 |
| 2012/0147573 A1* | 6/2012 | Lim | H05K 9/0028 361/753 |
| 2013/0133947 A1* | 5/2013 | Miller | G06F 3/044 174/84 C |
| 2015/0009642 A1* | 1/2015 | Caclard | H05K 5/0047 361/753 |
| 2015/0043141 A1* | 2/2015 | Pegg | H04M 1/0277 361/679.26 |
| 2016/0306391 A1* | 10/2016 | Yang | H04M 1/0266 |

* cited by examiner

ASSEMBLY FOR PORTABLE ELECTRONIC DEVICE

CROSS-REFERENCE TO RELATED APPLICATIONS

This application claims the benefit of U.S. Provisional Application No. 62/729,946, entitled "ASSEMBLY FOR PORTABLE ELECTRONIC DEVICE," filed Sep. 11, 2018, the entirety of which is incorporated herein by reference.

TECHNICAL FIELD

The present description relates generally to an electronic device, and, more particularly, to portable electronic device (e.g., smartphone) having various features and enhancements.

BACKGROUND

Portable electronic devices are known to include a housing and a cover glass that combines with the housing to enclose components such as a circuit board, a display, and a battery. Also, portable electronic devices are known to communicate over a network server to send and receive information, as well as communicate with a network carrier to send and receive voice communication.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

The following disclosure relates to an electronic device, such as a mobile communication device that takes the form of a smart phone or a tablet computer device. The electronic device may include several enhancements and modification not found on traditional electronic devices.

The electronic device may include a back plate having cladded layers such that a railing structure can be welded to the back plate and attached to a band of the electronic device. The back plate and the band can form conductive pathways for connecting components of the electronic device.

Parts of the electronic device can be welded together to provide structural support and or functional connections between operating components of the electronic device. Within a band, a back plate can support multiple operable components of the electronic device. The band, the welds, and/or the back plate can provide electrical connections between components. Conductive pathways provided by the welds can be provided with adequate strength and durability to reduce and avoid breakage so that sensitive components, such as a compass module, can operate without alterations that would cause interference. The welds can be provided in a sequence that mitigates the effects of heating during the welding process.

These and other embodiments are discussed below with reference to FIGS. 1-16. However, those skilled in the art will readily appreciate that the detailed description given herein with respect to these Figures is for explanatory purposes only and should not be construed as limiting.

Figure 1:
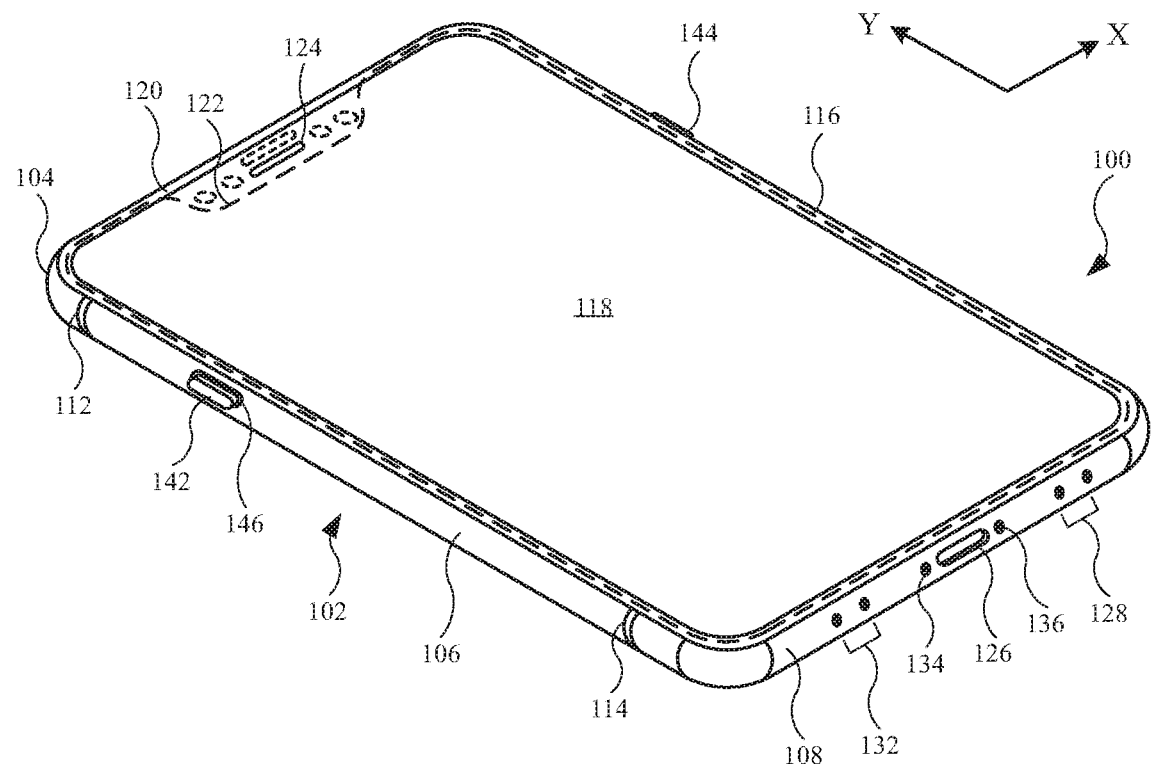
FIG. 1 illustrates a front isometric view of an embodiment of an electronic device, in accordance with some described embodiments.

FIG. 1 illustrates a front isometric view of an embodiment of an electronic device 100, in accordance with some described embodiments. In some embodiments, the electronic device 100 is a tablet computer device. In the embodiment shown in FIG. 1, the electronic device 100 is a mobile wireless communication device (a smartphone, for example). The electronic device 100 may include a band 102 that defines an outer perimeter of the electronic device 100. The band 102 may include a metal, such as aluminum, stainless steel, or an alloy that includes at least one of aluminum or stainless steel. The band 102 may be composed of several sidewall components, such as a first sidewall component 104, a second sidewall component 106, a third sidewall component 108 (opposite the first sidewall component 104), and a fourth sidewall component (not shown in FIG. 1). The aforementioned sidewall components may include any material(s) previously described for the band 102.

In some instances, some of the sidewall components form part of an antenna assembly (not shown in FIG. 1). As a result, a non-metal material, or materials, may separate the sidewall components of the band 102 from each other in order to electrically isolate the sidewall components. For example, a first composite material 112 separates the first sidewall component 104 from the second sidewall component 106, and a second composite material 114 separates the second sidewall component 106 from the third sidewall component 108. The aforementioned composite may include an electrically inert, or insulating, material(s), such as plastics and/or resin, as non-limiting examples.

The electronic device 100 may further include a display assembly 116 (shown as a dotted line) that is covered by a front cover 118. The display assembly 116 may include multiple layers (discussed below), with each layer providing a unique function. The display assembly 116 may be partially covered by a border 120, or frame, that extends along an outer edge of the front cover 118 and partially covers an outer edge of the display assembly 116. The border 120 can be positioned to hide or obscure any electrical and mechanical connections between the layers of the display assembly 116 and flexible circuit connectors. This will be shown below. Also, the border 120 may include uniform thickness. For example, the border 120 may include a thickness that generally does not change in the X- and Y-dimensions.

Also, as shown in FIG. 1, the display assembly 116 may include a notch 122, representing an absence of the display assembly 116. The notch 122 may allow for a vision system (discussed below) that provides the electronic device 100 with information for object recognition, such as facial recognition. In this regard, the electronic device 100 may include a masking layer with openings (shown as dotted lines) designed to hide or obscure the vision system, while the openings allow the vision system provide the object recognition information. This will be further discussed below. Also, the front cover 118 may be formed from a transparent material, such as glass, plastic, sapphire, or the like. In this regard, the front cover 118 may be referred to as a transparent cover, a transparent protective cover, or a cover glass (when the front cover 118 includes glass). As shown in FIG. 1, the front cover 118 includes an opening 124, which may represent a single opening of the front cover 118. The opening 124 may allow for transmission of acoustical energy (in the form of audible sound) into the electronic device 100, which may be received by a microphone (not shown in FIG. 1) of the electronic device 100. Further, the opening 124 may allow for transmission of acoustical energy (in the form of audible sound) out the electronic device 100, which may be generated by an audio module (not shown in FIG. 1) of the electronic device 100. Also, the electronic device 100 may not include a button, such as "home button," commonly found in electronic devices, as the front cover 118 does not include additional openings.

The electronic device 100 may further include a port 126 designed to receive a connector of a cable assembly. The port 126 allows the electronic device 100 to communication data information (send and receive), and also allows the electronic device 100 to receive electrical energy to charge a battery assembly (not shown in FIG. 1). Accordingly, the port 126 may include terminals (not shown in FIG. 1) that electrically couple to the connector.

Also, the electronic device 100 may include several openings. For example, the electronic device 100 may include openings 128 that allow an additional audio module (not shown in FIG. 1) of the electronic device to emit acoustical energy out of the electronic device 100. The electronic device 100 may further include openings 132 that allow an additional microphone (not shown in FIG. 1) of the electronic device to receive acoustical energy. Also, the electronic device 100 may include a first fastener 134 and a second fastener 136 designed to secure with a rail (not shown in FIG. 1) that is coupled to the front cover 118. In this regard, the first fastener 134 and the second fastener 136 are designed to couple the front cover 118 with the band 102.

The electronic device 100 may include several control inputs designed to provide a command to the electronic device 100. For example, the electronic device 100 may include a first control input 142 and a second control input 144. The aforementioned control inputs may be used to adjust the visual information presented on the display assembly 116 or the volume of acoustical energy output by an audio module, as non-limiting examples. The controls may include one of a switch or a button designed to generate a command to a processor circuit (not shown in FIG. 1). The control inputs may at least partially extend through openings in the sidewall components. For example, the second sidewall component 106 may include an opening 146 that receives the first control input 142.

Figure 2:
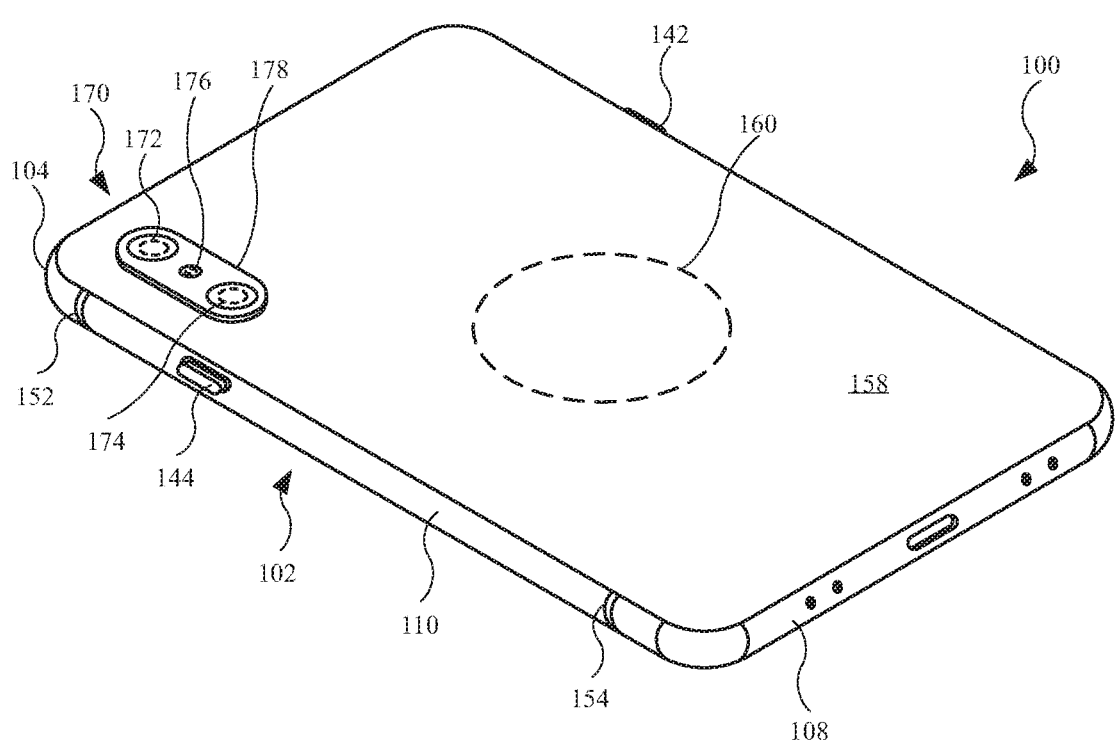
FIG. 2 illustrates a rear isometric view of the electronic device shown in FIG. 1.

FIG. 2 illustrates a rear isometric view of the electronic device 100 shown in FIG. 1. In addition to the aforementioned sidewall components, the band 102 may further include a fourth sidewall component 110. As shown, a third composite material 152 separates the first sidewall component 104 from the fourth sidewall component 110, and a fourth composite material 154 separates the fourth sidewall component 110 from the third sidewall component 108.

The electronic device 100 may further include a back cover 158 that couples with the band 102. In this regard, the back cover 158 may combine with the band 102 to form an enclosure of the electronic device 100, with the enclosure (band 102 and back cover 158) defining an internal volume that carries several internal components, such as a battery assembly, circuit board, vision system, as non-limiting examples. The back cover 158 may include any material(s) previously described for the front cover 118 (shown in FIG. 1). When the back cover 158 include a non-metal material, the electronic device 100 may provide hardware (and software) to support wireless charging. For example, the electronic device 100 may include a wireless power receiving module 160 (represented by a dotted line) covered by the back cover 158. The wireless power receiving module 160 is designed to receive an induced current when exposed to an alternating electromagnetic field. This will be further discussed below. Also, the front cover 118 (shown in FIG. 1) may be referred to as a "front protective cover" and the back cover 158 may be referred to as a "rear protective cover," as the front of the electronic device 100 is generally associated with the display assembly 116 (which is covered by the front cover 118), and the back of the electronic device 100 is generally associated with a rear wall, such as the back cover 158.

The electronic device 100 may further include a camera assembly 170, which may include a dual camera assembly. As shown, the camera assembly 170 may include a first camera module 172, a second camera module 174, and a light emitter 176 positioned between the first camera module 172 and the second camera module 174. The light emitter 176 is designed to provide additional lighting during an image capture event by the first camera module 172 and/or the second camera module 174. However, it is desired to isolate some of the light "leakage" from the light emitter into the first camera module 172 and the second camera module 174. In this regard, the camera assembly 170 may further include a trim element (not shown in FIG. 1) designed to optically isolate the light emitter 176 from the first camera module 172 and the second camera module 174. In this manner, the first camera module 172 and the second camera module 174 may only receive desired light from the light emitter 176, such as light reflected from an object, the image of which is the first camera module 172 and/or the second camera module 174). The trim element will be further shown and described below. Also, the camera assembly 170 may further include a protective cover 178 formed from a transparent material that covers the first camera module 172, the second camera module 174, and the light emitter 176.

However, the protective cover 178 may include a masking layer (not shown in FIG. 2) designed to at least partially obscure part of protective cover the first camera module 172, the second camera module 174, and the light emitter 176. It should be noted, however, that the masking layer includes openings that allow the first camera module 172 and the second camera module 174 to capture images, and that allow the light emitter 176 to emit light that exits the electronic device 100. Also, as shown in FIG. 2, the first camera module 172 and the second camera module 174 are aligned (collectively) in a manner that is parallel with respect to the second sidewall component 106 (shown in FIG. 1) and the fourth sidewall component 110. In other words, an imaginary line can be drawn through the first camera module 172 and the second camera module 174 that is parallel with respect the second sidewall component 106 (shown in FIG. 1) and the fourth sidewall component 110.

Figure 3:
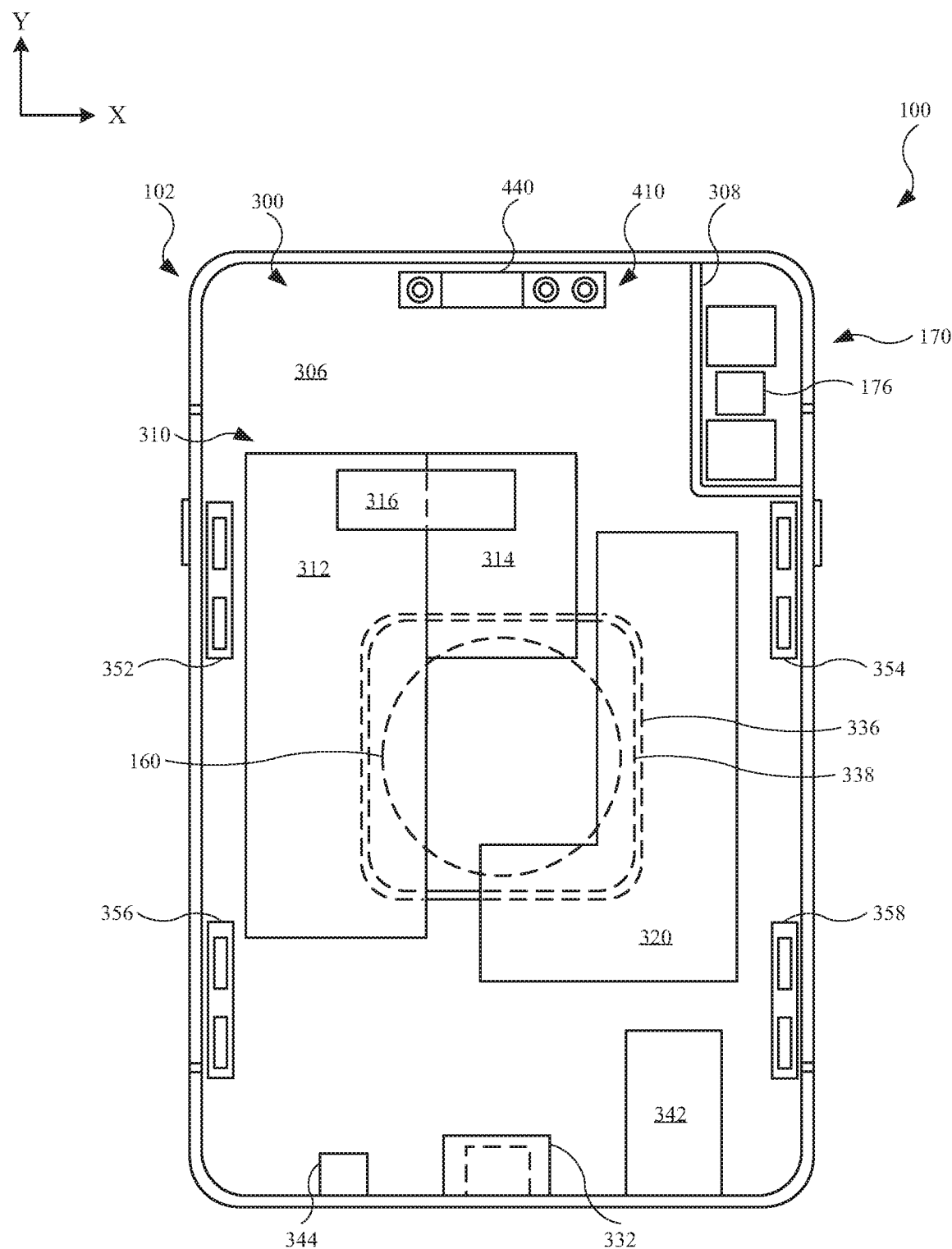
FIG. 3 illustrates a plan view of the electronic device shown in FIG. 1, with the display assembly and the protective cover removed.

FIG. 3 illustrates a plan view of the electronic device 100 shown in FIG. 1, with the display assembly and the protective cover removed. The layout of several components in the internal volume. For purposes of simplicity and illustration, electrical connections, such as flexible circuit, wires, cables, etc., between internal components are removed. As shown, the electronic device 100 may include a vision system 410 and a bracket assembly 440 used to carry the vision system 410. The vision system 410 may provide with the electronic device 100 with information related to object recognition, including facial recognition. The bracket assembly 440 is designed to maintain a fixed distance between the optical components of the vision system 410. The features of the vision system 410 and the bracket assembly 440 will be further discussed below.

The electronic device 100 may further include a back plate 306 that provides structural support. The back plate 306 may include a rigid material, such as a metal. Also, the back plate 306 may be coupled to the band 102. In this manner, the back plate 306 may also provide an electrical grounding path for components electrically coupled to the back plate 306. Also, the back plate 306 may include a wall 308. The wall 308 may combine with the band 102 to surround the camera assembly 170. The wall 308 may also limit or prevent light generated from the light emitter 176 from further entering the internal volume 300.

The electronic device 100 may further include a battery assembly 310 that includes a first battery component 312 coupled with a second battery component 314 by coupling member 316. The coupling member 316 may include an adhesive material. Both the first battery component 312 and the second battery component 314 are designed to generate electrical energy that can be used by several aforementioned components in the internal volume 300. Also, as shown in FIG. 3, the battery assembly 310 resembles an L-shape, based upon the combined shape of the first battery component 312 and the second battery component 314.

The shape of the battery assembly 310 may accommodate other components. For example, the electronic device 100 may further include a circuit board 320. The circuit board 320 may include at least two circuit boards in a stacked configuration. The stacked configuration may conserve space in the internal volume 300, particularly in least one of the X- and Y-dimensions, X- and Y-dimensions (as well as a Z-dimension, discussed later) referring to Cartesian coordinates. The circuit board 320 may include several active components (such as integrated circuits) that provide the primary processing for the electronic device 100. Also, similar to the battery assembly 310, the circuit board 320 may resemble an L-shape. In this manner, both the battery assembly 310 and the circuit board 320 can be shaped to conserve space in the internal volume 300.

The electronic device 100 may further include a dock 332 in a location corresponding to the port 126 (shown in FIG. 1). The dock 332 may include terminals and other electrical connection points (not shown). The dock 332, in conjunction with the port 126, can receive a connector (used with a cable assembly), thereby allowing the electronic device to send and receive data transmission. Also, the dock 332 can receive electrical energy used to recharge the battery assembly 310.

Moreover, the electronic device 100 may further include a wireless power receiving module 160 designed to provide electrical energy to the battery assembly 310. The wireless power receiving module 160 may include a receiver coil (not shown in FIG. 3) designed to receive an induced current by an alternating electromagnetic field generated by a transmitter coil (not shown) that is external with respect to the electronic device 100. Also, the back plate 306 may include an opening 336 (defined by a void in the back plate 306) such that the back plate 306 does not impede the alternating electromagnetic field. Also, the wireless power receiving module 160 may include a shielding element 338 designed to shield at least some components in the internal volume 300 from the alternating electromagnetic field.

The electronic device 100 may further include an audio module 342 designed to generate acoustical energy in the form of audible sound. The electronic device 100 may further include a microphone 344 designed to receive acoustical energy. Also, the electronic device may further include several rail clips designed to receive rails 404 secured to the front cover 118 (shown in FIG. 1). For example, the electronic device 100 may include a first rail clip 352, a second rail clip 354, a third rail clip 356, and a fourth rail clip 358. The rails 404 designed to couple with the aforementioned rail clips will be shown below.

Figure 4:
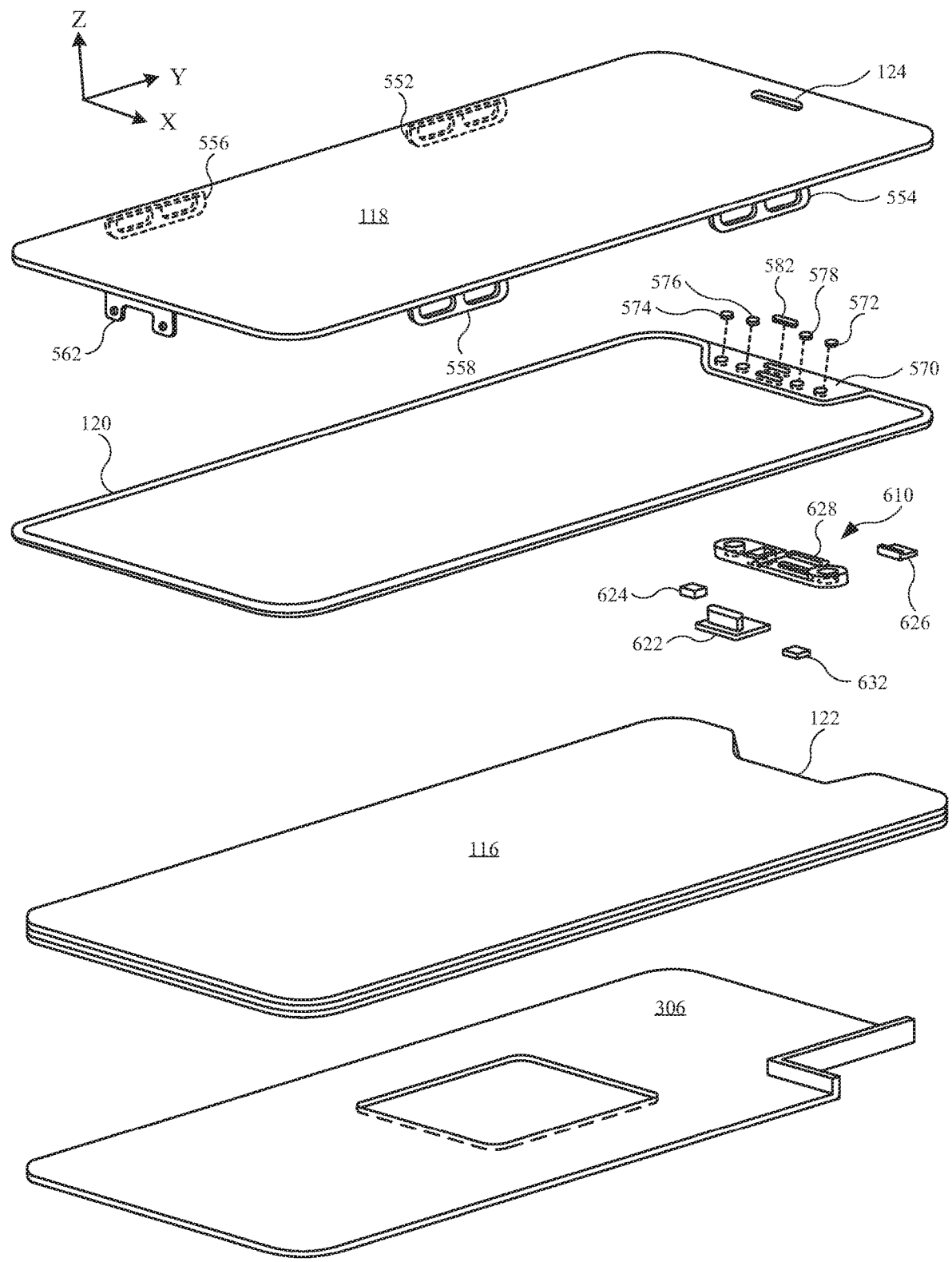
FIG. 4 illustrates an exploded view of the protective cover and the display assembly, as well as several additional components of the electronic device (shown in FIG. 1).

FIG. 4 illustrates an exploded view of the front cover 118 and the display assembly 116, as well as several additional components of the electronic device 100 (shown in FIG. 1). As shown, the front cover 118 may include several rails designed to secure the front cover 118. For example, the front cover 118 may include a first rail 552, a second rail 554, a third rail 556, and a fourth rail 558 designed to couple with the first rail clip 352, a second rail clip 354, a third rail clip 356, and a fourth rail clip 358, respectively, shown in FIG. 3. Also, the front cover 118 may further include a fifth rail 562 designed to receive the first fastener 134 and the second fastener 136 (shown in FIG. 1).

The border 120 may secure with a surface (such as an internal surface) of the front cover 118. In addition to the border 120 hiding or obscuring electrical and mechanical connections to the display assembly 116, additional layers may be used to hide or obscure some features. For example, an electronic device described herein may include a masking layer 570 designed to at least partially hide or obscure the vision system 410 and the bracket assembly 440. The masking layer 570 may include an opaque material designed to block light, including visible light, UV light, and IR light. The opaque material may include an ink material that is adhered to a surface of the front cover 118. Also, the masking layer 570 may include an appearance, in terms of color and reflectivity, designed to match that of the border 120. For example, when the border 120 includes a black or white appearance (as non-limiting examples), the masking layer 570 may include a black or white appearance, respectively.

In order to allow the vision system 410 to provide object recognition, the masking layer 570 may include several openings (not labeled). However, at least some of the openings may be covered or filled by a material that is semi-opaque. For example, an electronic device described herein may include a layer 572 that covers an opening of the masking layer 570, a layer 574 that covers an additional opening of the masking layer 570, and a layer 576 that covers an additional opening of the masking layer 570. In some embodiments, the layer 572, the layer 574, and the layer 576 include an appearance, in terms of color and/or reflectivity, similar to that of the masking layer 570 (and accordingly, an appearance, in terms of color and/or reflectivity, similar to that of the border 120). However, the layer 572, the layer 574, and the layer 576 may be designed to filter out some light in some frequencies while selectively transmitting light in other frequencies. For example, the layer 572, the layer 574, and the layer 576 may block visible light (as well as other light), and allow IR light to permeate. As a result, the layer 572, the layer 574, and the layer 576 may be referred to as visible light filters. The layer 572, the layer 574, and the layer 576 may cover components of the vision system 410 designed to transmit/emit IR light or receive IR light. A light module 624 may also be aligned with a visible light filter.

Further, an electronic device described herein may include a layer 578 that covers an additional opening of the masking layer 570, and a layer 582 that covers an additional opening of the masking layer 570. In some embodiments, the layer 578 and the layer 582 include an appearance, in terms of color and/or reflectivity, similar to that of the masking layer 570 (and accordingly, an appearance, in terms of color and/or reflectivity, similar to that of the border 120). However, the layer 578 and the layer 582 may be designed to filter out some light in some frequencies while selectively transmitting light in other frequencies. For example, the layer 578 and the layer 582 may block IR light (as well as other light), and allow visible light to permeate. As a result, the layer 578 and the layer 582 may be referred to as IR light filters. The layer 578 and the layer 582 may cover components of the vision system 410 designed to receive visible light. An ambient light sensor 626 may also be aligned with an IR light filter.

In some instances, the bracket assembly 440 and the vision system 410 are not affixed in the electronic device 100 (shown in FIG. 1). Rather, the bracket assembly 440 (along with the vision system 410) may be placed in the internal volume 300 and are allowed to generally move freely with respect to, for example, the back plate 306 and the band 102. However, as the front cover 118 is coupled with the band 102 (by way of the rails 404 securing with the rail clips), the position of the bracket assembly 440 and the vision system 410 can be adjusted to a desired location in the internal volume 300, and compressive forces can retain the bracket assembly 440 and the vision system 410 in a desired location.

In this regard, an electronic device described herein may include an alignment module 610 that is coupled with the front cover 118. In some instances, the masking layer 570, along with the light filter layers described above, is positioned between the front cover 118 and the alignment module 610. The alignment module 610 may be coupled with the front cover 118 in a location such when the front cover 118 is assembled with the enclosure (or with the remaining portion of an electronic device), the alignment module 610 guides the modules of the vision system 410 such that the modules align with a desired light filter layer described above. This will be further shown and discussed below.

An electronic device described herein may further include an audio module 622 designed to generate acoustical energy. The audio module 622 may be seated on the alignment module 610 such that the audio module 622 is aligned with the opening 124 of the front cover 118. An electronic device described herein may further include a light module 624 designed to generate light, such as IR light. The light module 624 may be used in conjunction with the vision system 410. For example, the light module 624 may provide additional IR light under conditions of relatively low light. The alignment module 610 may align the light module 624. An electronic device described herein may further include an ambient light sensor 626 designed to detect an amount of light external with respect to the electronic device. In some instances, the ambient light sensor 626 provides light conditions (such as low-light conditions) that can be used to activate the light module 624. The alignment module 610 may include a rail 628 used to align the ambient light sensor 626. Also, an electronic device described herein may further include a microphone 632 designed to receive acoustical energy. The microphone 632 may be at least partially aligned with the opening 124 of the front cover 118.

The notch 122 (in the display assembly 116) is used to accommodate the alignment module 610, as well as the vision system 410. Also, the back plate 306 may be positioned below the display assembly 116 (in the Z-dimension). Accordingly, the back plate 306 may provide support to the display assembly 116 as well as other components.

Figure 5:
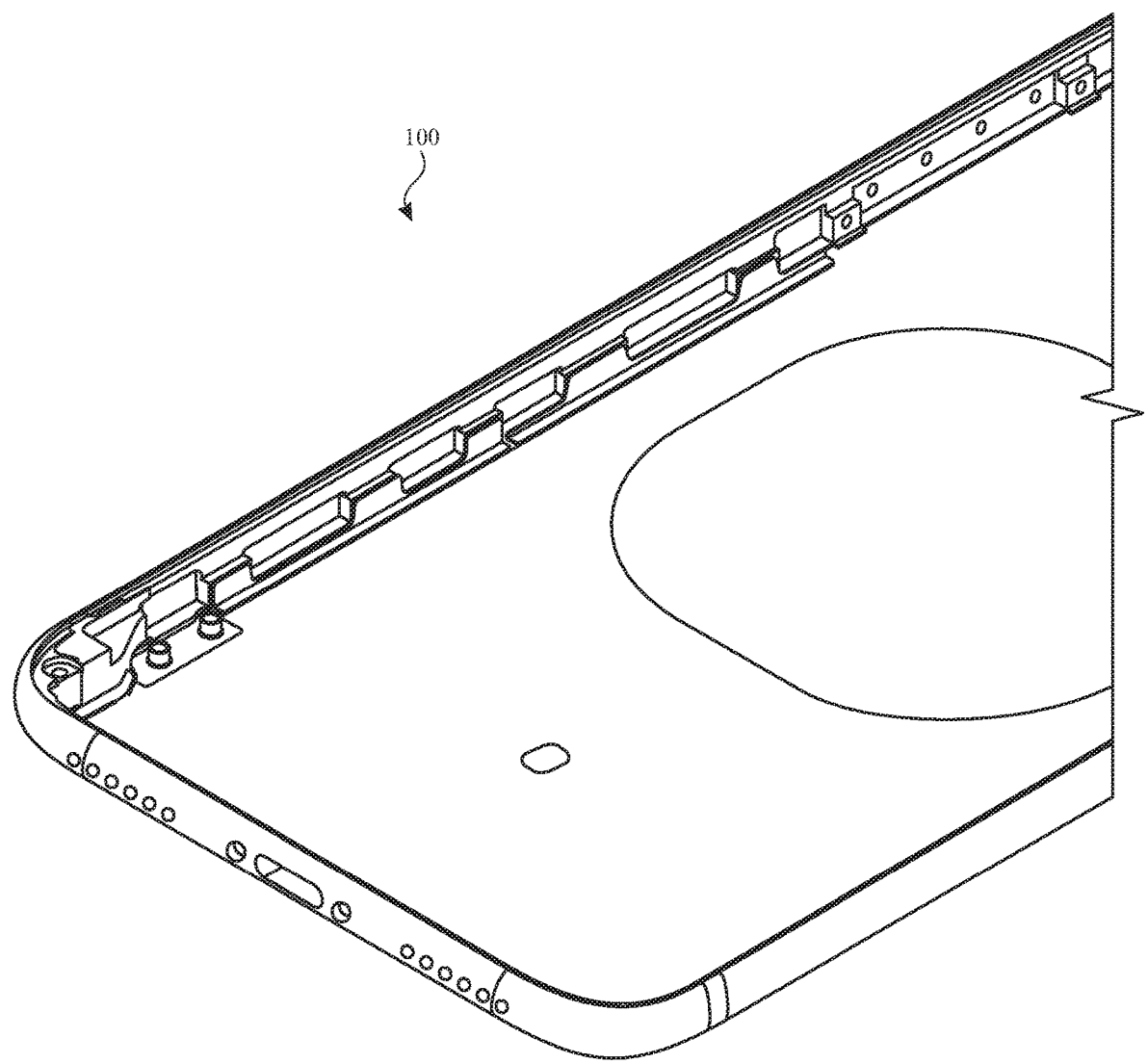
FIGS. 5-7 illustrate a back plate and side walls of a device with a cladded back plate.
Figure 6:
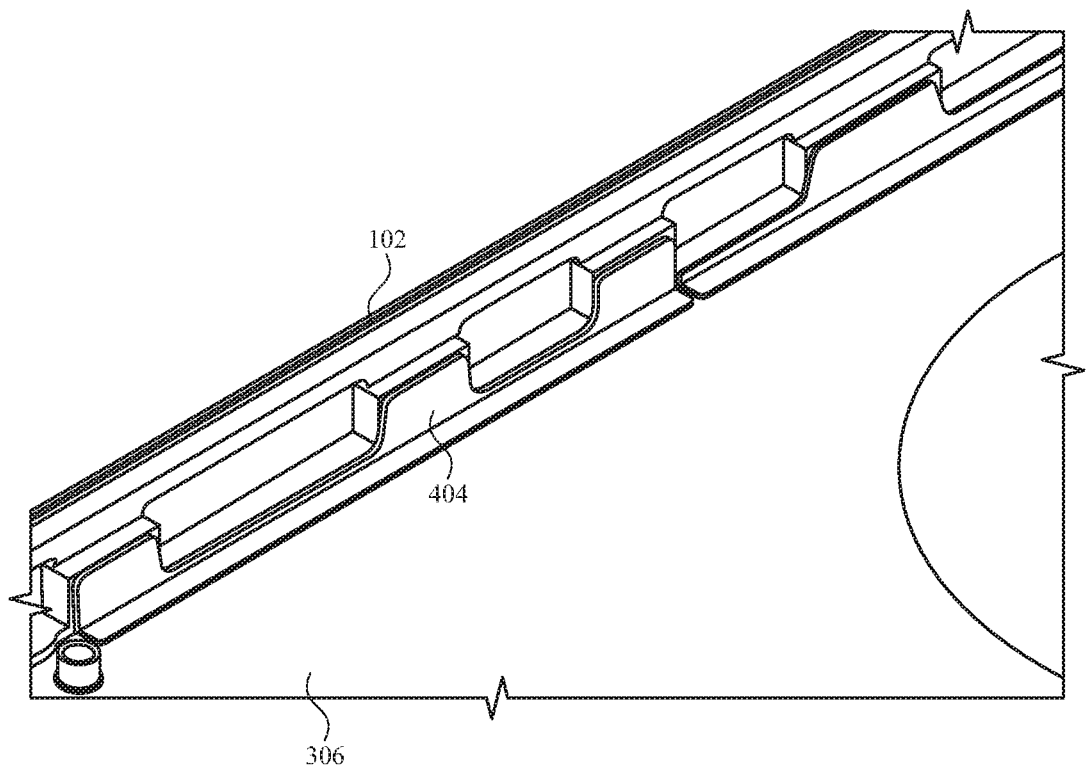

Electronic devices may include support plates or back plates 306 that are constructed of dissimilar metal materials, such as the electronic device as shown in FIGS. 5 and 6. The back plate 306 is cladded constructed of stainless steel layer, followed by a copper layer, followed by another stainless steel layer (e.g., SS-Cu-SS). The side walls 2104 may be constructed of aluminum. The rails 404 which mount the back plate 306 to the side walls 2104 may be constructed of stainless steel. The rails 404 may be of an L shape with a bottom portion toward the back plate 306 and a top portion toward the side walls 2104. By choosing the materials as set forth above, the bottom portion of the rail 404 may be welded from the back plate 306 underside (e.g., rear side of the back plate) to form a secure attachment with improved joint strength (e.g., the cladded back plate is not welded directly to the aluminum). Put alternatively, fewer materials are involved in the welding process, resulting in a more reliable attachment between the side walls and the back plate 306.

Figure 7:
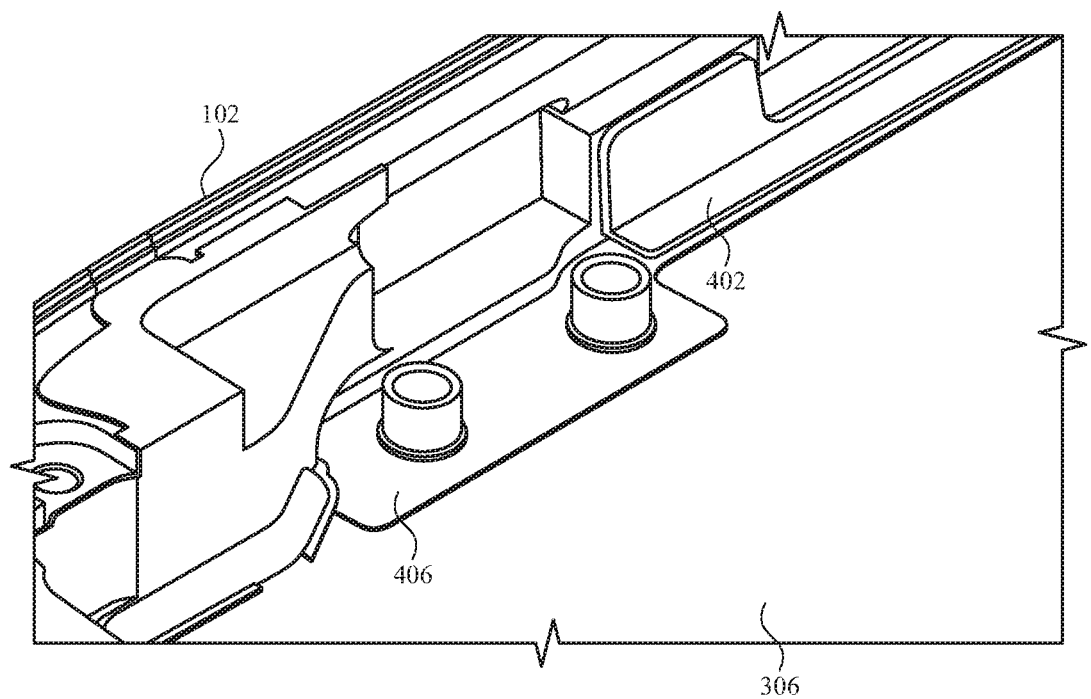

Additional interposer structures 406 may be utilized in accordance with dissimilar welding as set forth above. For example, as shown in FIG. 7, a portion of the back plate is removed for space utilization. Inserted in the cut out space, for example, is a stainless steel portion, but may be a copper portion or other materials suitable for welding to the cladded back plate 306. The removed portion of the back plate 306 may be cut with a dove-tail configuration or other mating configurations adapted for interference fitting. A lip 402 from the bottom portion of the rail 404 may be positioned over the outer perimeter of the inserted portion, which may be welded for additional secure attachment.

Figure 8:
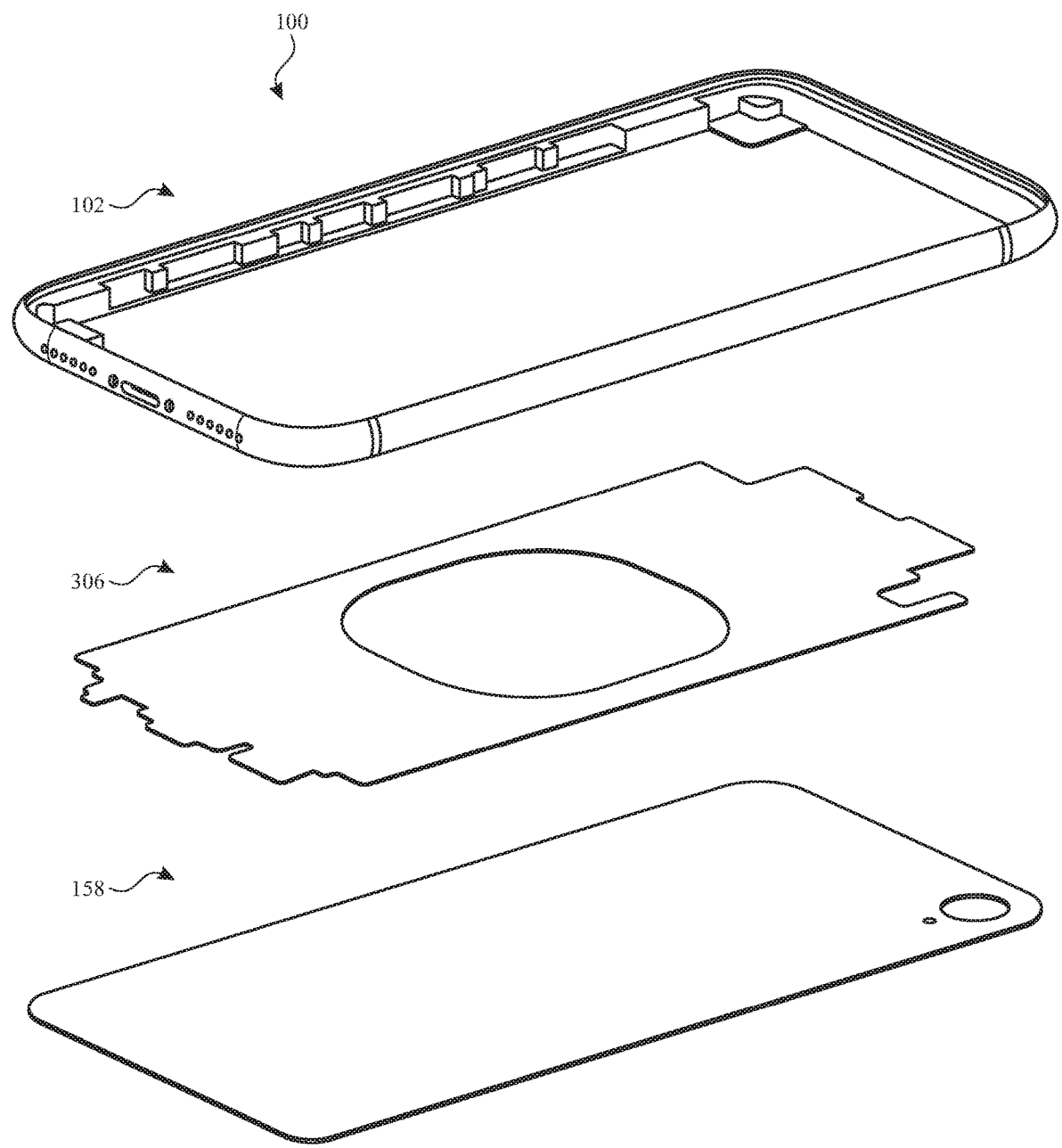
FIG. 8 illustrates an exploded view of the back assembly of the electronic device (shown in FIG. 1).

Parts of the electronic device can be welded together to provide structural support and or functional connections between operating components of the electronic device. As shown in FIG. 8, the electronic device 100 can include a band 102 that defines at least a portion of an outer periphery of the electronic device 100. The back plate 306 can be provided along a side of the band 102, and a back cover 158 can be provided over the back plate 306 to define an outer surface of the assembled electronic device.

Figure 9:
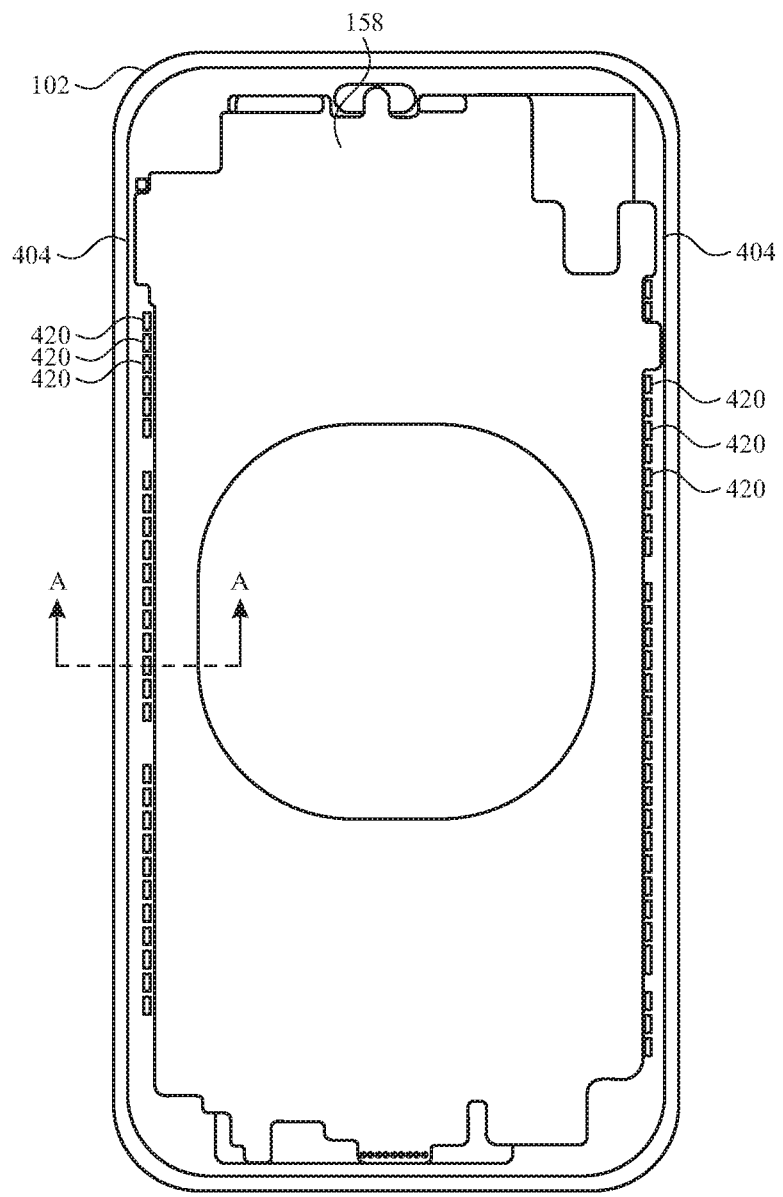
FIG. 9 illustrates a front view of the back assembly of the electronic device.

As shown in FIG. 9, the back plate 306 can be connected to the band 102 by multiple welds 420 along overlapping portions of the back plate 306 and the band 102. For example, as discussed further herein, the band 102 can include or be connected to one or more rails 404 that extend inwardly from the outer boundary defined by the band 102. Such rails 404 can be provided along one or more inner sides of the band 102, and the back plate 306 can be welded to each of the rails 404. Multiple welds 420 can be provided along each of the rails 404, as discussed further herein. The welds 420 or sets of welds 420 can be separated from each other or overlapping, as discussed further herein.

Figure 10:
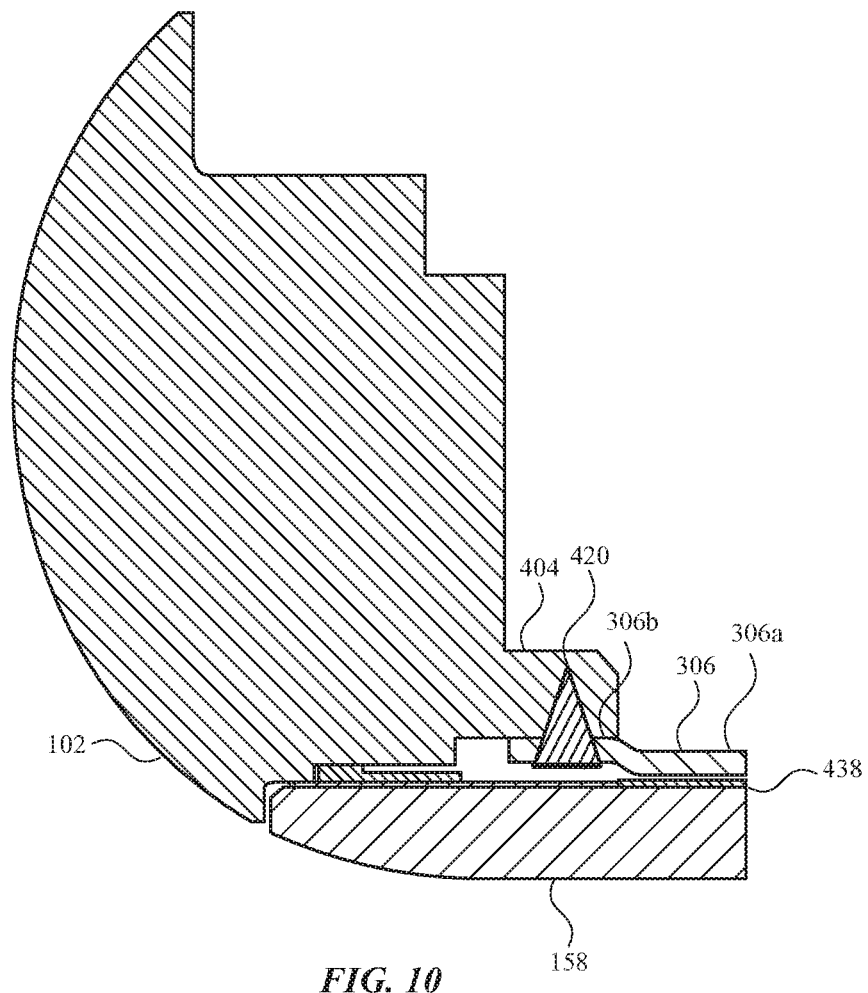
FIG. 10 illustrates a sectional view of the back assembly of the electronic device.

As shown in FIG. 10, the back plate 306 can be welded to the band 102 (e.g., the rail 404) at an outer portion thereof. The weld 420 can have a depth that extends through an entire thickness (e.g., height) of the back plate 306 and into the band 102 (e.g., rail 404). For example, the weld 420 can have a depth of about 0.1-0.5 mm (e.g., 0.2 mm). The weld 420 can extend into the band 102 (e.g., rail 404) to a depth of about 0.01-0.10 mm (e.g., 0.05 mm). The weld 420 can be wider at the back plate 306 and taper to a point within the band 102. For example, the weld 420 can have a width of about 0.1-0.5 mm (e.g., 0.3 mm) at the back plate 306 and about 0.01-0.10 mm (e.g., 0.05 mm) at the interface between the back plate 306 and the band 102 (e.g., rail 404).

An inner portion of the back plate 306 can be bonded (e.g., with an adhesive 438) to the back cover 158. The back plate 306 can be non-planar to form an inner portion 306a and an outer portion 306b. The inner portion 306a of the back plate 306 can protrude relative to the outer portion 306b, so the weld 420 can be provided within a space that will be between the back plate 306 and the back cover 158 when assembled. This clearance allows the parts to be assembled without interference between the weld 420 and the back cover 158. Additionally or alternatively, the back cover 158 can be bonded directly to the band 102.

Figure 11:
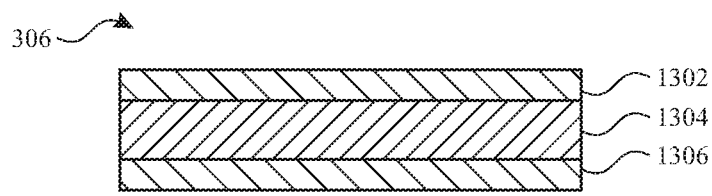
FIG. 11 illustrates a sectional view of the back plate.

As shown in FIG. 11, the back plate 306 can include layers of cladded materials. For example, the back plate 306 can include outer layers 1302 and 1306 and an inner layer 1304 that provide both rigidity and electrical conductivity. For example, the outer layers 1302 and 1306 can include stainless steel or another material (e.g., metal) that has high rigidity (e.g., higher than a material of the inner) for structural support. The inner layer 1304 can include aluminum, copper, or another material (e.g., metal) that has high electrical conductivity (e.g., higher than a material of the outer layers). The inner layer 1304 can be of a same material as the band 102. The outer layers 1302 and 1306 can be of a different material than the band 102. As such, different materials can be provided at the location of the welds 420. The welds 420 can be provided in a manner that bonds dissimilar materials. The welds 420 can provide structural connections and electrical connections between the band 102 and the inner layer of the back plate 306.

Within the band 102, the back plate 306 can support multiple operable components of the electronic device. The band 102, the welds 420, and/or the back plate 306 can provide electrical connections between components.

Figure 12:
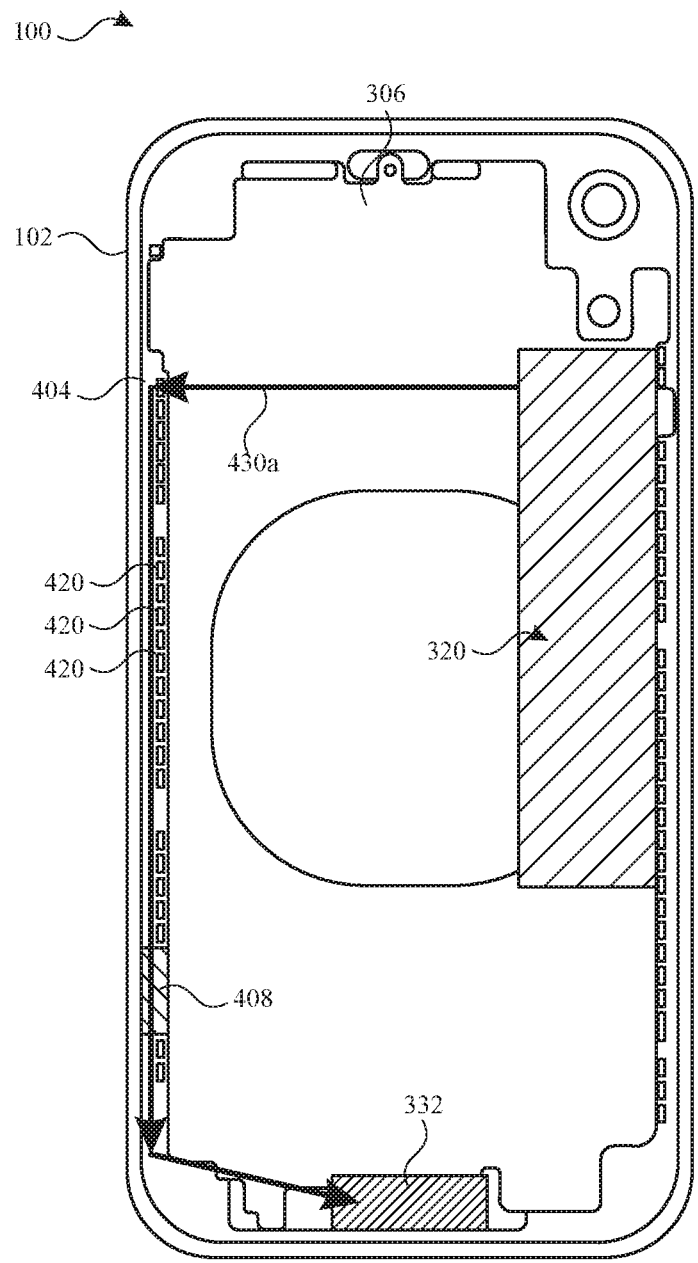
FIG. 12 illustrates a front view of the electronic device providing a first electrical pathway.

As shown in FIG. 12, the electronic device 100 can include a circuit board 320 that may include several active components (such as integrated circuits) that provide the primary processing for the electronic device 100, as discussed above. The electronic device 100 can further include a dock 332 that can receive a connector, thereby allowing the electronic device 100 to send and receive data transmission, as discussed above. The circuit board 320 and the dock can be connected to each other via the band 102, the welds 420, and/or the back plate 306. For example, the band 102, the welds 420, and/or the back plate 306 can provide a ground return path for components electrically connected thereto. For example, the back plate 306 can provide a ground return path for the circuit board 320, the dock 332, and the compass module 408. An example of an electrical pathway is shown in FIG. 12, in which the dock is electrically connected to the circuit board 320 via the welds 420, inter alia. While an electrical current path 430a is shown along welds 420 on one side of the electronic device 100, it will be understood that, additionally or alternatively, the current path 430a can extend through welds 420 on another (e.g., opposite) side of the electronic device 100.

The electronic device 100 can further include a compass module 408 that is separate from the circuit board 320. The compass module 408 can include a magnetometer for detecting a presence and direction of a magnetic field. The compass module 408 can be configured to detect a magnetic field of the Earth, and thereby provide information that can be used to determine the orientation of the electronic device 100 with respect to magnetic poles of the Earth. As shown in FIG. 12, the circuit board 320 can be on a first side of the electronic device 100, and the compass module 408 can be on a second side of the electronic device 100, opposite the first side.

As further shown in FIG. 12, at least one current path 430a can extend through welds 420 on a side of the electronic device 100 that is adjacent to the compass module 408. For example, the current path 430a can extend around, past, and/or adjacent to the compass module 408. While the current path 430a is maintained, the magnetic fields generated by the current path 430a can remain substantially constant. As such, the compass module 408 can be calibrated to account for these magnetic fields during a calibration operation. Thereafter, the compass module 408 can be sensitive to the magnetic field of the Earth and output information relating to corresponding detections.

Figure 13:
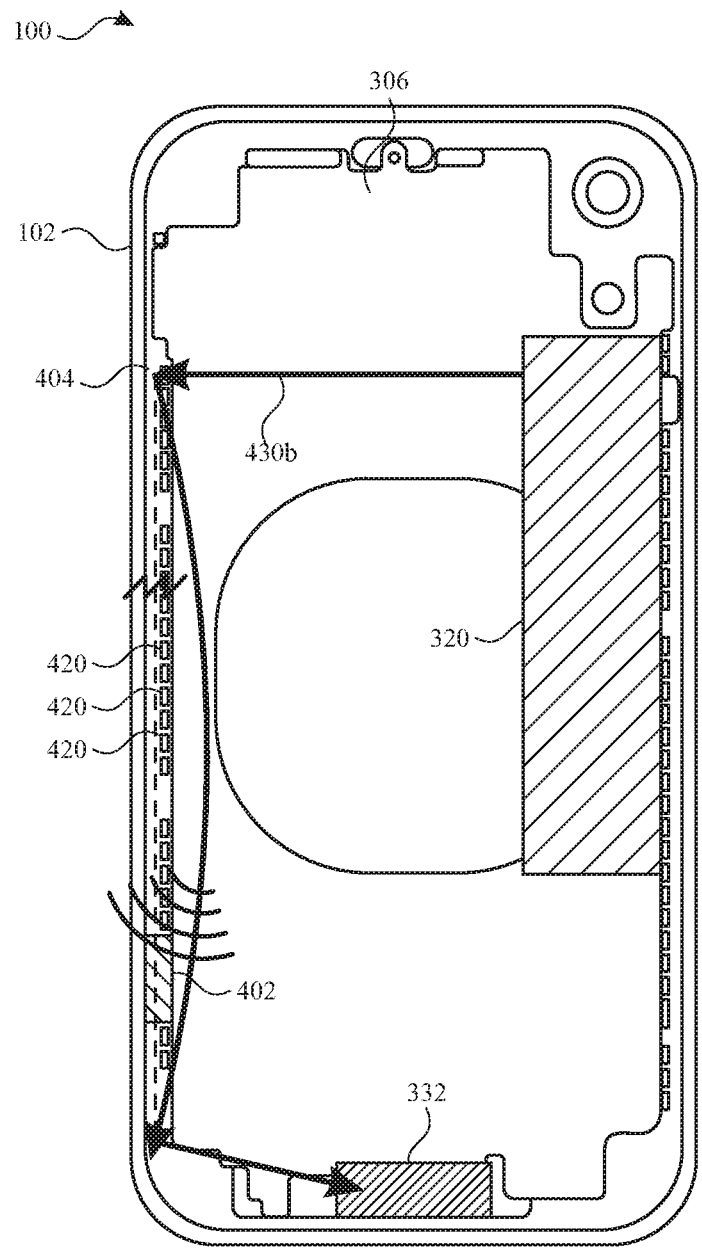
FIG. 13 illustrates a front view of the electronic device providing a second electrical pathway.

As shown in FIG. 13, the current path 430a is altered if one or more welds 420 are broken. In such an event, another current path 430b can be provided through the back plate 306. For example, where a weld 420 is broken or becomes otherwise disconnected on a side of the electronic device 100, a discontinuity is created. Current can flow through an alternate path. However, such a rearrangement of current flow can alter the magnetic fields that are generated. As such, the detections performed by the compass module 408 can be somewhat altered until a new calibration operation is performed. Where the current paths 430a in the vicinity of the compass module 408 are altered, the alteration of the magnetic field can be significant.

Accordingly, it can be beneficial to improve the strength and durability of welds 420 so that, when subjected to external forces, the welds 420 maintain mechanical connections to support the components and electrical connections to facilitate accurate operation of the components, such as the compass module 408.

The welds 420 can be provided in one or more patterns that provide durable connections. As previously illustrated, the welds 420 can be provided in discrete sections of along the back plate 306 and band 102. Individual welds 420 can overlap to create continuous weld sets. Individual weld sets can be spaced apart from each other or overlapping each other.

Figure 14:
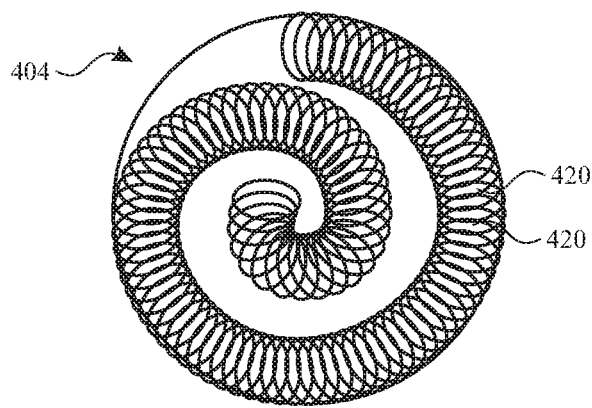
FIG. 14 illustrates a view of a set of welds.

As shown in FIG. 14, a set of individual welds 420 can be provided in a spiral pattern. Each individual weld 420 can be overlapping to some extent with one or more adjacent welds 420. The welds 420 can be formed in sequence by starting at a center and moving outwardly in a spiral pathway. Additionally or alternatively, the welds 420 can be formed in sequence by starting at an outer periphery and moving inwardly in a spiral pathway. Individual spiral shapes can be separate from each other and/or overlapping with each other.

Figure 15:
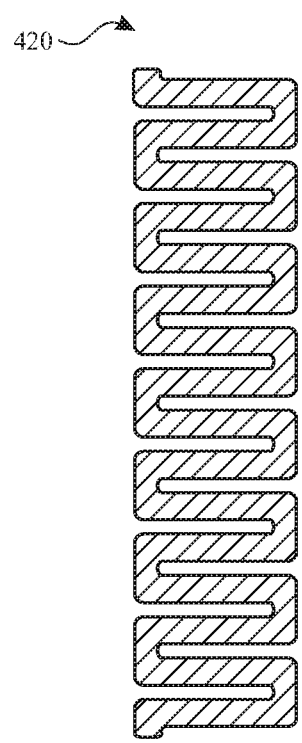
FIG. 15 illustrates a view of another set of welds.

As shown in FIG. 15, a set of individual welds 420 can be provided in a serpentine pattern. Each individual weld 420 can be overlapping to some extent with one or more adjacent welds 420. The welds 420 can be formed in sequence by starting at one end and moving along a desired pathway. The pathway can be in one or more of a variety of shapes, including serpentine, sinusoidal, undulating, square wave, triangle wave, saw tooth, meander, and combinations thereof. Individual patterns can be separate from each other and/or overlapping with each other.

Figure 16:
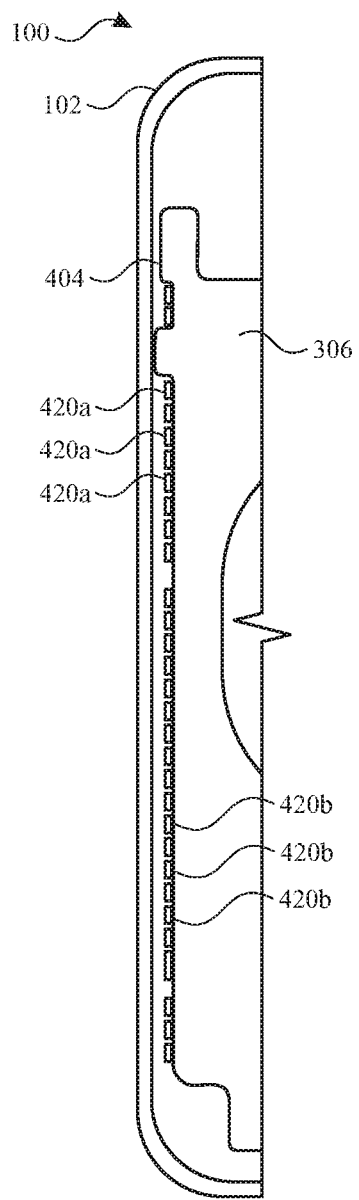
FIG. 16 illustrates a front view of a portion of the electronic device.

The welds 420 can be provided in a sequence that mitigates the effects of heating during the welding process. For example, as shown in FIG. 16, after one or more first welds 420a are provided in a first region, one or more second welds 420b can be provided in another region that is remote from the first region. Such an approach avoids the application of a second weld 420b in close proximity to a first weld 420a while heat from the first weld 420a remains in the target region of the second weld 420b. Accordingly, the target locations are welded prior to heating or after heat has been dissipated sufficiently. As such, the first welds 420a can be formed at a first temperature, and the second welds 420b can be formed while the first welds 420a are at a second temperature that is lower than the first temperature.

In one example of a sequence, as shown in FIG. 16, a back plate 306 is welded to a band 102 of an electronic device 100 with multiple first welds 420a. The back plate 306 can also be welded to the band 102 with multiple second welds 420b. The first welds 420a can be on a first side opposite and the second welds 420b can be on a second side, opposite the first side. The sequence can alternate between the first welds 420a and the second welds 420b, so that neither is formed until its neighboring weld has cooled.

Figure 17:
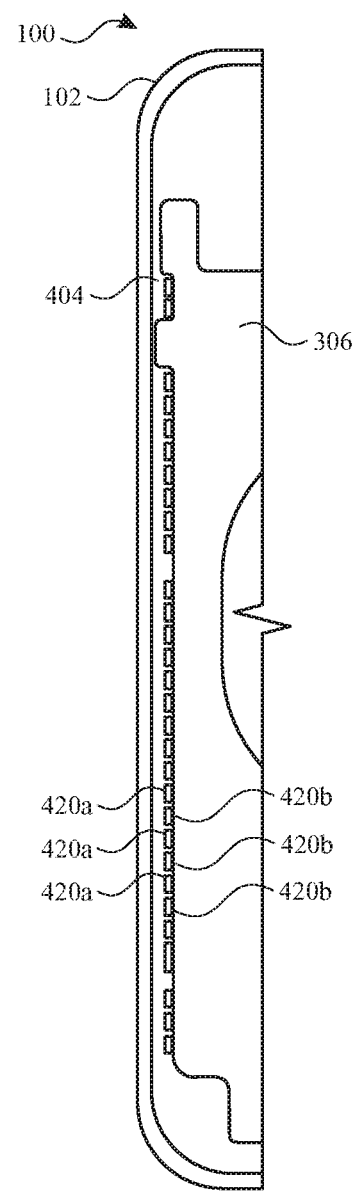
FIG. 17 illustrates a front view of a portion of the electronic device.

In one example of a sequence, as shown in FIG. 17, a back plate 306 is welded to a band 102 of an electronic device 100 with multiple first welds 420a. Thereafter, the back plate 306 is welded to the band 102 with multiple second welds 420b. Each of the second welds 420b can be positioned between a corresponding pair of the first welds 420a. Accordingly, none of the welds are formed immediately after its neighboring weld is formed, but rather at a time after its neighboring weld has cooled.

It will be appreciated that this can be repeated for any number of welds, which can be distributed in space and applied at different times to mitigate the effects of heat during the welding process. Accordingly, the welds can be stronger and more durable for having been provided under more favorable conditions that would be present if provided immediately after and immediately adjacent to (or overlapping) a preceding weld.

A reference to an element in the singular is not intended to mean one and only one unless specifically so stated, but rather one or more. For example, "a" module may refer to one or more modules. An element proceeded by "a," "an," "the," or "said" does not, without further constraints, preclude the existence of additional same elements.

Headings and subheadings, if any, are used for convenience only and do not limit the invention. The word exemplary is used to mean serving as an example or illustration. To the extent that the term include, have, or the like is used, such term is intended to be inclusive in a manner similar to the term comprise as comprise is interpreted when employed as a transitional word in a claim. Relational terms such as first and second and the like may be used to distinguish one entity or action from another without necessarily requiring or implying any actual such relationship or order between such entities or actions.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A phrase "at least one of" preceding a series of items, with the terms "and" or "or" to separate any of the items, modifies the list as a whole, rather than each member of the list. The phrase "at least one of" does not require selection of at least one item; rather, the phrase allows a meaning that includes at least one of any one of the items, and/or at least one of any combination of the items, and/or at least one of each of the items. By way of example, each of the phrases "at least one of A, B, and C" or "at least one of A, B, or C" refers to only A, only B, or only C; any combination of A, B, and C; and/or at least one of each of A, B, and C.

It is understood that the specific order or hierarchy of steps, operations, or processes disclosed is an illustration of exemplary approaches. Unless explicitly stated otherwise, it is understood that the specific order or hierarchy of steps, operations, or processes may be performed in different order. Some of the steps, operations, or processes may be performed simultaneously. The accompanying method claims, if any, present elements of the various steps, operations or processes in a sample order, and are not meant to be limited to the specific order or hierarchy presented. These may be performed in serial, linearly, in parallel or in different order. It should be understood that the described instructions, operations, and systems can generally be integrated together in a single software/hardware product or packaged into multiple software/hardware products.

In one aspect, a term coupled or the like may refer to being directly coupled. In another aspect, a term coupled or the like may refer to being indirectly coupled.

Terms such as top, bottom, front, rear, side, horizontal, vertical, and the like refer to an arbitrary frame of reference, rather than to the ordinary gravitational frame of reference. Thus, such a term may extend upwardly, downwardly, diagonally, or horizontally in a gravitational frame of reference.

The disclosure is provided to enable any person skilled in the art to practice the various aspects described herein. In some instances, well-known structures and magnets are shown in block diagram form in order to avoid obscuring the concepts of the subject technology. The disclosure provides various examples of the subject technology, and the subject technology is not limited to these examples. Various modifications to these aspects will be readily apparent to those skilled in the art, and the principles described herein may be applied to other aspects.

All structural and functional equivalents to the elements of the various aspects described throughout the disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for".

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. An electronic device comprising:
   a band defining an outer periphery of the electronic device;
   a back plate connected to the band with multiple welds, wherein the back plate comprises cladded layers of different metal materials, wherein each of the welds extends through the layers;
   a circuit board on a first side of the back plate;
   a dock for receiving a connector and being electrically connected to the circuit board via the back plate, the welds, and the band; and
   an electronic component adjacent to the welds, on a second side of the back plate, and operatively connected to the circuit board.

2. The electronic device of claim 1, wherein the back plate provides a ground return path for the circuit board, the dock, and the electronic component.

3. The electronic device of claim 1, wherein the welds form multiple weld sets, wherein each of the weld sets is spaced apart from a corresponding pair of adjacent weld sets and each weld set comprises a same pattern of welds.

4. The electronic device of claim 1, wherein cladded layers comprise outer layers of a first metal material and an inner layer of a second metal material.

5. The electronic device of claim 1, further comprising:
   a front cover comprising glass and coupled to the band; and
   a back cover comprising glass and coupled to the back plate.

6. The electronic device of claim 1, wherein the electronic component is a compass module.

7. An electronic device comprising:
   a band defining an outer periphery of the electronic device; and
   a back plate welded to the band with multiple weld sets, wherein each of the weld sets is spaced apart from a corresponding pair of adjacent weld sets and each weld set comprises a same pattern of welds, wherein each of the pattern of welds forms a spiral shape or a serpentine shape.

8. The electronic device of claim 7, wherein the back plate comprises cladded layers of different metal materials, wherein each of the welds extends through the layers.

9. The electronic device of claim 8, wherein cladded layers comprise outer layers of a first metal material and an inner layer of a second metal material.

10. The electronic device of claim 7, further comprising:
    a circuit board;
    a dock for receiving a connector and being electrically connected to the circuit board via the back plate, the weld sets, and the band; and
    a compass module adjacent to the weld sets.

11. The electronic device of claim 10, wherein the back plate provides a ground return path for the band.

12. A method comprising:
    welding a back plate to a band of an electronic device with multiple first welds; and
    after welding with the multiple first welds, welding the back plate to the band with multiple second welds, each of the second welds being between a corresponding pair of the first welds, wherein the first welds are formed at a first temperature, and the second welds are formed while the first welds are at a second temperature that is lower than the first temperature.

13. The method of claim 12, wherein each of the first welds and second welds forms a spiral shape.

14. The method of claim 12, wherein each of the first welds and second welds forms a serpentine shape.

15. The method of claim 12, wherein the back plate comprises cladded layers of different metal materials, wherein each of the welds extends through the layers.

16. The method of claim 15, wherein cladded layers comprise outer layers of a first metal material and an inner layer of a second metal material.

* * * * *